Figure 1:
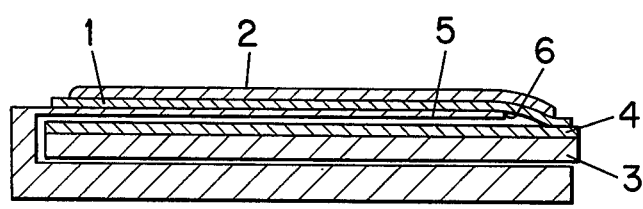

United States Patent

Gidley et al.

[11] 4,066,177
[45] Jan. 3, 1978

[54] LOCATION OF OBJECTS

[75] Inventors: John Arthur Frederick Gidley, Sutton Coldfield; Barry Frederick Irving, Aldridge; Barry Keith Johnson, Alum Rock, all of England

[73] Assignee: Imperial Metal Industries (Kynoch) Limited, Birmingham, England

[21] Appl. No.: 716,456

[22] Filed: Aug. 23, 1976

[30] Foreign Application Priority Data

Aug. 26, 1975 United Kingdom ............... 35203/75

[51] Int. Cl.² ............................................. B65G 61/00
[52] U.S. Cl. .................................... 214/152; 34/12; 34/19; 101/382 MV; 214/1 BS; 269/8; 335/285; 427/127; 427/388 R

[58] Field of Search ............... 156/182, 281, 239, 344, 156/247, 584, 249, 598, 278; 427/127, 401, 388 R, 444; 428/900, 908; 335/285; 269/8; 101/382 MV, 395, 401.1, 426; 34/12, 19, 18, 42; 214/1 R, 1 BS, 152; 271/193, 163

[56] References Cited

U.S. PATENT DOCUMENTS

| | | | |
|---|---|---|---|
| 1,329,962 | 2/1920 | Ennis | 214/15 |
| 3,027,835 | 4/1962 | Meese et al. | 335/285 |
| 3,121,131 | 2/1964 | Blume | 101/382 MV |
| 3,282,765 | 11/1966 | Pine et al. | 156/247 |

*Primary Examiner*—William A. Powell
*Assistant Examiner*—J. J. Gallagher
*Attorney, Agent, or Firm*—Cushman, Darby & Cushman

[57] ABSTRACT

Locating a tacky polymer-coated steel sheet on a magnetic rubber-covered glass support by sliding the support out from under a shield and carrying the steel sheet with the magnetic support gradually to place the sheet on the support.

7 Claims, 2 Drawing Figures

LOCATION OF OBJECTS

This invention relates to locating members and has particular, but not exclusive, reference to locating sheet steel members on a planar magnetic support.

In the production of photopolymer printing plates, there is produced a sheet steel member which has an upper tacky layer on it. The sheet steel member has to be located onto a magnetic support for dying purposes. Because of the importance of maintaining the thickness of the tacky layer constant, it is necessary to place the sheet steel onto the magnetic support without causing undue distortion. It has proved difficult to place large sheet members onto large magnets without causing rapid jumping of one part of the sheet member onto the magnet as a result of magnetic attraction. This uneven jumping can cause movement within the tacky layer so as to ruin the product.

By the present invention there is provided a method of locating a sheet of magnetisable metal member having a tacky upper layer thereon onto a planar magnetic support, which includes the steps of 1. locating the planar magnetic support under a separating member, a portion of the planar magnetic support being exposed at the forward end thereof, 2. advancing the magnetisable metal member forward over the edge of the planar separating member to come into contact with the forward end of the planar magnetic support, and 3. advancing the planar magnetic support from beneath the planar separating member to draw the magnetisable metal member forward and into contact with the magnetic support. The metal may be steel. The magnetic support may be a sheet of glass having a sheet of magnetic rubber on the surface. The tacky upper layer may be a photopolymerisable layer. The separating member may be planar.

The present invention further provides in a method of manufacturing coated sheet steel, a method of locating a sheet of magnetisable metal member having a tacky upper layer thereon onto a planar magnetic support, which includes the steps of 1. locating the planar magnetic support under a separating member, a portion of the planar magnetic support being exposed at the forward end thereof, 2. advancing the sheet steel member forward over the edge of the planar separating member to come into contact with the forward end of the planar magnetic support, and 3. advancing the planar magnetic support from beneath the planar separating member to draw the sheet member forward and into contact with the magnetic support. The separating member may be formed of brass.

Figure 2:
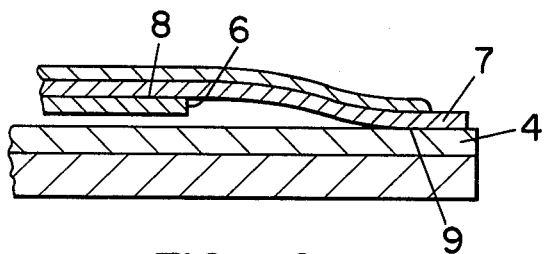

By way of example, embodiments of the present invention will now be described with reference to the accompanying drawings, of which:

FIG. 1 is a schematic cross-section of a sheet partially on the magnetic support; and FIG. 2 is an enlarged portion of the arrangement illustrated in FIG. 1.

In the production of tacky polymer-coated sheet steel for use as a printing plate, there is provided a sheet member which has a mobile tacky upper layer. This sheet member has to be transferred to a magnetic rubber-coated glass layer to maintain it flat for drying purposes. The steel sheet is shown at 1 in the accompanying drawing and the tacky layer is shown at 2. The glass is shown at 3 and the magnetic rubber is shown at 4. Initially, the rubber-coated glass is located beneath a brass planar support and separating member 5 with the forward end of the magnetic rubber and glass support just clear of the leading edge 6 of the brass support 5. The steel sheet is pushed forward by suitable means (not shown) until the leading edge 7 of the steel sheet advances over the edge 6 and is eventually pulled down by the effect of the magnet and under the action of gravity to contact the magnetic rubber layer 4. Clearly, the steel sheet will be able to advance a small amount over the magnetic rubber before it is pulled down because of the resistance of the sheet to flexing. The steel sheet will adopt a very open Z-shape with smooth curves between the two flat portions 8 and 9. Once magnetic contact has been made, the glass and rubber support is advanced forward and pulls the magnetic steel sheet with it. As the rubber and steel clear the leading edge 6 of the support 5, ever-increasing contact takes place until eventually all of the magnetic steel is pulled down onto the rubber and is fully supported by the rubber and glass support.

By this method, a smooth contact is made between the two and the tacky layer 2 is not adversely affected by the smooth and uniform contacting process.

We claim:

1. A method of locating a flexible sheet of magnetisable metal having a tacky upper layer thereon onto a planar magnetic support which includes the steps of:
    a. locating the planar magnetic support under a separating member, a portion of the planar magnetic support being exposed at the forward end thereof
    b. advancing the magnetisable metal member forward over the edge of the separating member to come into contact with the forward edge of the planar magnetic support, and
    c. advancing the planar magnetic support from beneath the separating member to draw the magnetisable metal member forward into further contact with the magnetic support.

2. A method as claimed in claim 1 in which the magnetisable metal is steel.

3. A method as claimed in claim 1 in which the magnetic support is a sheet of glass having a sheet of magnetic rubber on the surface.

4. A method as claimed in claim 1 in which the separating member is planar.

5. A method as claimed in claim 1 in which the separating member is non-magnetic.

6. A method as claimed in claim 1 in which the separating member is formed of brass.

7. In a method of manufacturing coated sheet steel, a method of locating a flexible sheet of magnetisable metal member having a tacky upper layer thereon onto a planar magnetic support, which includes the steps of:
    a. locating the planar magnetic support under a separating member, a portion of the planar magnetic support being exposed at the forward end thereof,
    b. advancing the sheet steel member forward over the edge of the planar separating member to come into contact with the forward end of the planar magnetic support, and
    c. advancing the planar magnetic support from beneath the planar separating member to draw the sheet member forward and into further contact with the magnetic support.

* * * * *